(12) United States Patent
Cannara et al.

(10) Patent No.: US 8,130,533 B2
(45) Date of Patent: Mar. 6, 2012

(54) THERMOELECTRIC DEVICE AND METHOD

(75) Inventors: Rachel Cannara, Adliswil (CH); Bernd W. Gotsmann, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 463 days.

(21) Appl. No.: 12/245,112

(22) Filed: Oct. 3, 2008

(65) Prior Publication Data
US 2010/0085071 A1 Apr. 8, 2010

(51) Int. Cl.
*G11C 13/00* (2006.01)
*G11B 5/127* (2006.01)

(52) U.S. Cl. ............... 365/106; 360/125.06
(58) Field of Classification Search .......... 324/66
See application file for complete search history.

(56) References Cited

U.S. PATENT DOCUMENTS

| 7,847,222 | B2* | 12/2010 | Guha et al. | 219/553 |
|---|---|---|---|---|
| 2007/0108488 | A1* | 5/2007 | Suh et al. | 257/295 |
| 2007/0196645 | A1* | 8/2007 | Duerig et al. | 428/336 |
| 2007/0261729 | A1* | 11/2007 | Hu | 136/204 |
| 2008/0012094 | A1* | 1/2008 | Ma et al. | 257/614 |
| 2009/0139244 | A1* | 6/2009 | Ullo et al. | 62/3.6 |

* cited by examiner

*Primary Examiner* — Hoai V Ho
*Assistant Examiner* — Min Huang
(74) *Attorney, Agent, or Firm* — Tutunjian & Bitetto, P.C.; Dan Morris

(57) ABSTRACT

A system, device and method for electrically addressing an element include providing a thermoelectric layer in proximity with an area to be addressed and positioning a probe in proximity of the thermoelectric layer. Electrical activity is induced in the thermoelectric layer by applying heat from the probe. A response is caused in the area to be addressed.

15 Claims, 5 Drawing Sheets

THERMOELECTRIC DEVICE AND METHOD

BACKGROUND

1. Technical Field

The present invention relates to thermoelectric phase change cells and more particularly to a multilayered programmable device structure and method employing a thermoelectric material for storing a state in a phase change cell.

2. Description of the Related Art

There are many applications that involve probe tips to be used as movable electrical contacts. For example, in probe storage using phase change media, the probe is used to provide an electrical contact so that current can be applied to a predefined position of the storage media. In order to address several bits of stored information, the probe is able to move and make contact with individual bit positions.

Another example using probe tips includes probe-based patterning for micro and nanofabrication. In numerous methods of patterning, a current has to be applied locally to a point of a sample surface at which a physical or chemical modification is to be induced. This modification is later exploited to transform into a pattern or is the pattern itself.

Another example that involves probe tips includes metrology. For testing and characterizing of electronic devices, it is desirable to have local electrical probes available that can be used to locally address individual parts of circuits.

A generic problem for all of these applications, particularly when a nanoscale contact is used, is that the ability to pass electrical current from a probe to a substrate is subject to chemical and geometrical changes of the probe and/or the electrical contact to be addressed. The reasons for this are tribological, electrochemical or age related. It is therefore an unsolved problem to produce reliable formation of an electrical contact for various applications, especially for contact sizes in the nanometer regime.

SUMMARY

A system, device and method for electrically addressing an element include providing a thermoelectric layer in proximity with an area to be addressed and positioning a probe in proximity of the thermoelectric layer. Electrical activity is induced in the thermoelectric layer by applying heat from the probe. A response is caused in the area to be addressed.

A device for electrically addressing an element includes a thermoelectric layer formed in proximity of an area to be addressed. The thermoelectric layer is configured to locally generate charge flow in response to an induced heat gradient from a probe. A layer, including the area to be addressed, is configured to be responsive to the charge flow from the thermoelectric layer to cause a measurable response in the layer.

A system for electrically addressing an element includes a heated probe configured to be positioned over at least one addressable position on a device. The device includes a thermoelectric layer formed in proximity of an area to be addressed. The thermoelectric layer is configured to locally generate charge flow in response to an induced heat gradient from the probe. A layer, including the area to be addressed, is configured to be responsive to the charge flow from the thermoelectric layer to cause a measurable response in the layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
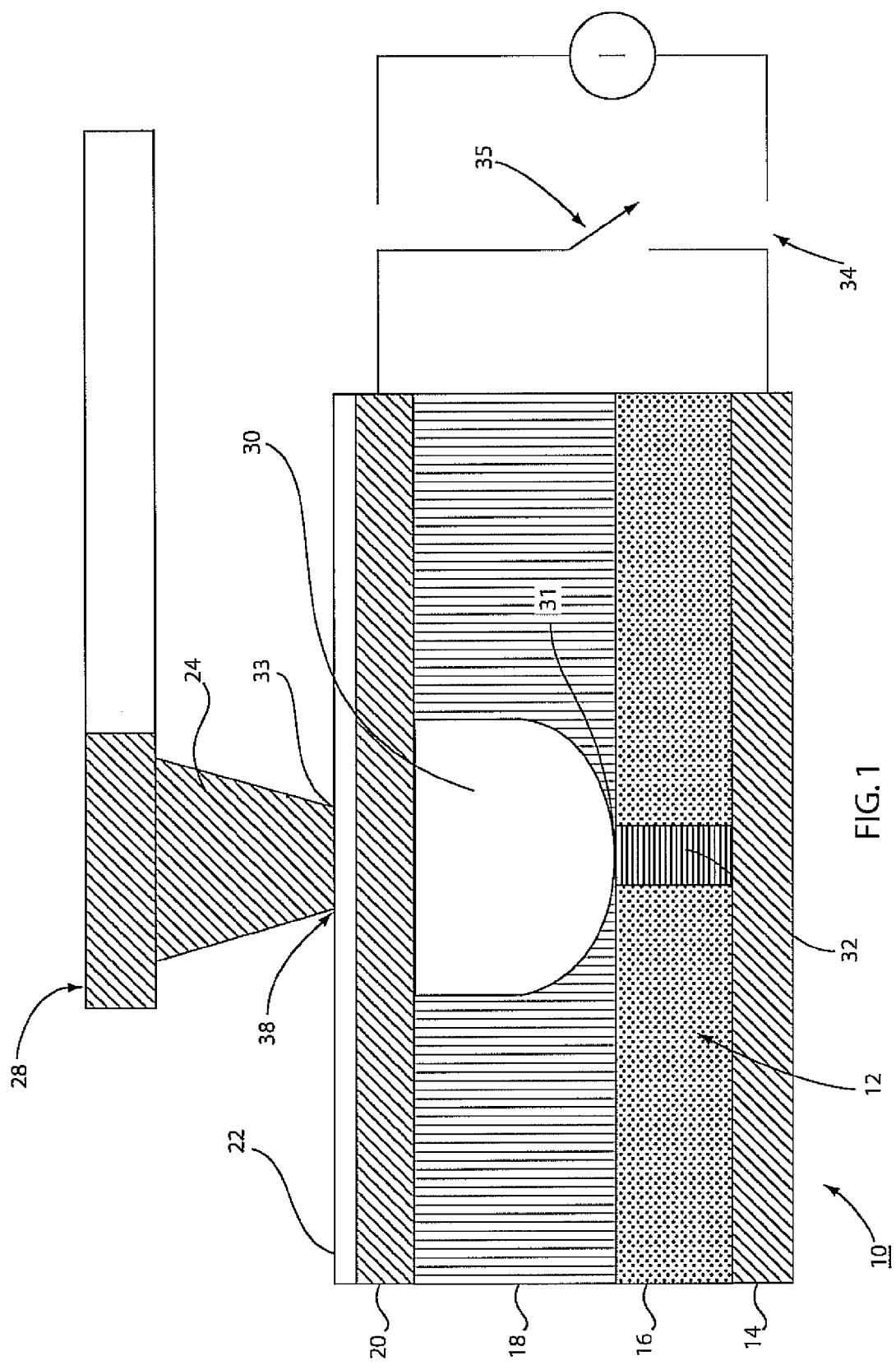
FIG. 1 is a cross-sectional view of a device/system for addressing a memory location using a thermoelectric layer in accordance with one embodiment.

In applications that employ probe tips, an electrical probe usually serves as a local current or voltage source. In accordance with the present principles, a thin layer of a thermoelectric material is added onto a layer or device on which probing or patterning is to be performed. A heatable probe is used instead of an electrical probe. As a consequence, the probe can be used to locally (in a lateral sense) heat the thermoelectric layer, that in itself can be uniform and does not have to (but may) be structured laterally.

This local application of heat induces a local temperature gradient which induces a thermoelectric voltage in the thermoelectric material. A resulting potential difference can serve as a local voltage or current source, depending on the circuitry in the application.

In a particularly useful embodiment, the thermoelectric material is employed to provide a local current for an application (e.g., a readout or change of phase in a phase change material memory cell). The current is produced locally by application of heat using a nanoscale probe. The heat gradient generates a voltage drop between the two surfaces of a thermoelectric layer, as well as the current that flows in the direction of heat flow.

Embodiments of the present invention can take the form of an entirely hardware embodiment, or an embodiment including both hardware and software elements. In one embodiment, the present invention may be implemented for use with software, which includes but is not limited to firmware, resident software, microcode, etc.

The present embodiments may be implemented as a circuit or circuits as part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods described herein may be employed in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a basic layout of an illustrative device 10 is shown in cross-section to demonstrate structure and operations in accordance with the present principles. For illustration purposes, FIG. 1 shows an application for switching a phase change memory element 12. However, the other applications are contemplated and include, but are not limited to metrology applications, phase change patterning, phase change memory applications, etc.

Device 10 includes at least one phase change memory element 12. In one embodiment, an array of elements may be employed. Element 12 is created by forming a first conductive electrode 14. Conductive electrode 14 may include a metal, an alloy or a conductive or semiconductive non-metal. For example, copper, aluminum, titanium, gold, silver, etc. or alloys thereof may be employed. In other embodiments, doped polysilicon or other materials may be employed.

A phase change material 16 is formed on or near the first electrode 14. The phase change material may be any material that changes phase or responds with a discernable and recordable change. In particularly useful embodiments, chalcogenide glass may be employed, including, for example, an alloy of germanium, antimony and tellurium (GST).

A thermoelectric layer 18 is formed at or near the phase change layer 16. The thermoelectric layer 18 is close enough to the phase change layer 16 to affect a change in material 16 during heating of the thermoelectric layer 18. This will be explained in greater detail hereinafter.

A second electrode 20 is formed over the thermoelectric layer 18 such that thermoelectric layer 18 and phase change layer 16 are sandwiched between electrodes 14 and 20. Second electrode 20 may include the same materials as the first electrode 14. A capping layer 22 may optionally be employed to protect the electrode 22. Capping layer 22 may include a dielectric material such as silicon oxide, silicon nitride, a polymeric material or any other suitable materials or combination thereof.

For the memory cell application, writing and reading operations can be performed. Writing of a bit at a predefined position 32 in phase change layer 16 is performed by moving a heated probe 28 to a position 38. A temperature gradient 30 is formed, which extends into the thermoelectric layer 18 and is sized on the order of a probe-surface contact diameter provided by the size of the apex of tip 24 (or tip radius) of the probe 28. In one embodiment, the tip radius measures on the order of between 1 nm and 1000 nm. A voltage is induced between electrode 20 and point 31. External circuitry 34 provides an open switch 35, which is closed to provide a current I that is used to program the phase of the bit-position 32 in phase change material 16. The external circuitry 34 for the writing process is closed to permit the current generated in the thermoelectric layer 18 due to the heat gradient 30 to induce a phase change to write data to the position 32.

A reading process uses the same probe 28 but with less heat applied than in the writing process. The reduced temperature gradient 30 with respect to the writing process induces a smaller current. This smaller current is used to read the phase (e.g., resistivity) state of the bit at position 32, but is too small to change the phase. Switch 35 is closed to permit current to flow and the bit to be read.

Thermoelectric layer 18 may include thermoelectric materials, such as, for example, $Bi_2Te_3$, $Sb_2Te_3$ or similar materials. Such materials have Seebeck-coefficients of about 100-200 μV/K. In one example, with a heated probe 28, a temperature gradient (30) within the sample of, e.g., approximately 200 K can be reached by applying a reasonable amount of power. This translates to a voltage induced in the thermoelectric layer 18 of about 20-40 mV. A resistance of the memory cell for a phase change application may be about 1-10 kOhm; therefore, upon closing the switch (35), a current of 10 μA can be provided. This is sufficient for switching the phase change memory cell 12 in a write operation. For a read operation, even less current is needed.

The writing speed is not necessarily limited to the slow thermal time constant of a heater (not shown) incorporated in the probe, but can be controlled by the speed of the switch 35, which is preferably a solid state switch. The heater may be left on (i.e., remain hot at all times) and switch 35 closed for the writing step.

The thickness of the thermoelectric layer 18 should be of the order of the diameter of the probe surface contact, which should be of the order of the diameter of the memory cell (e.g., about 10-30 nm). A patterned media with electrically isolated cells (except for perhaps common electrodes for electrodes 14 and 20) will improve performance. It should be understood that while layers are depicted for electrodes 14 and 20, layer 16 and layer 20 other structures may be employed including isolated cells with larger vertical aspect ratios.

Figure 2:
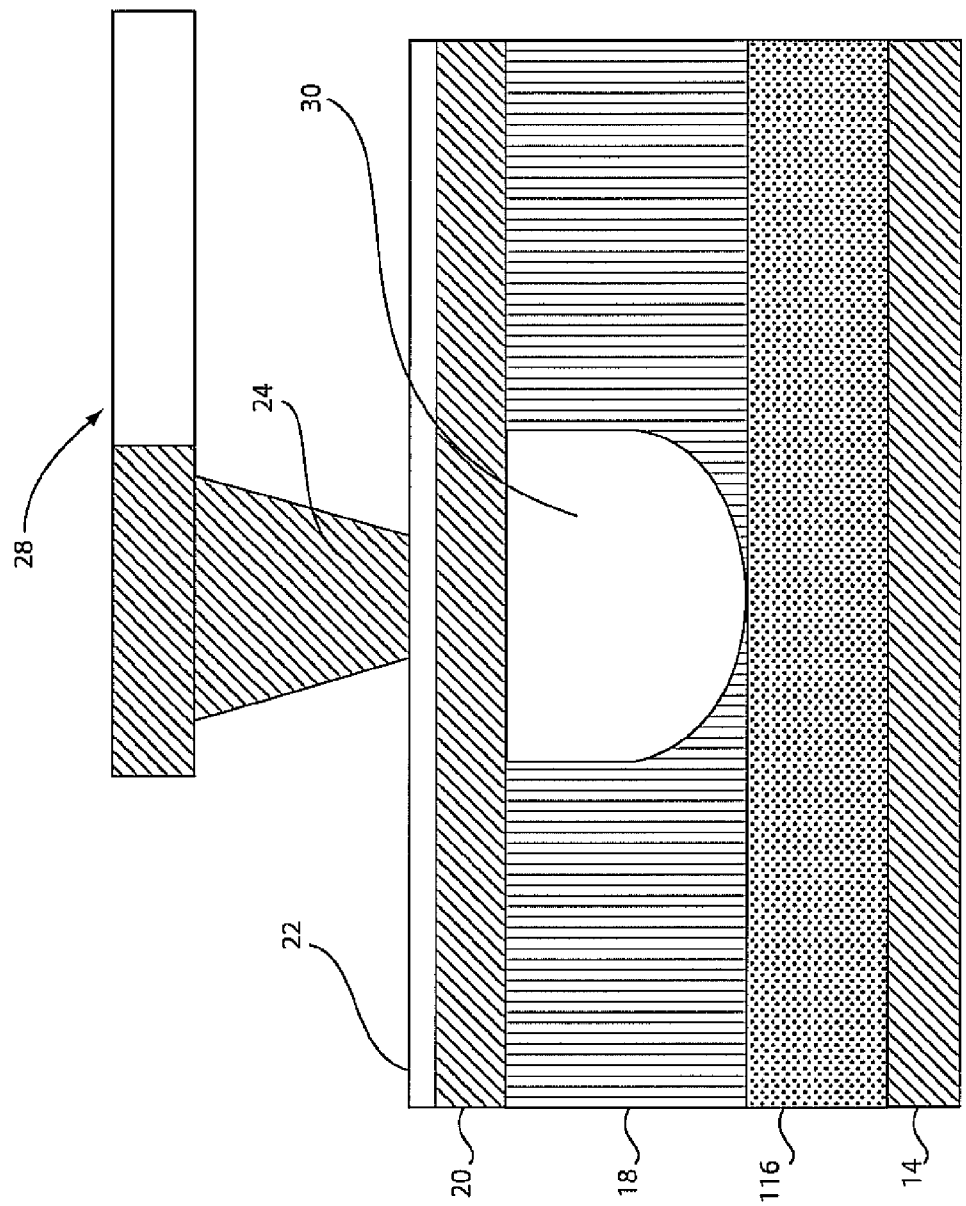
FIG. 2 is a cross-sectional view of a device/system for patterning a layer using a thermoelectric layer in accordance with one embodiment.

Referring to FIG. 2, a patterning application is illustratively depicted. The phase change layer 16 of FIG. 1 is replaced by a layer 116 that is to be patterned upon application of a voltage between a bottom and top side of a patterning film 116. A sandwich structure including electrodes 14 and 20 and the thermoelectric layer 18 can be employed.

If a local voltage and/or very restricted current (or charge) is used for patterning, then external circuitry (34) is not necessary. The description of a suitable thermoelectric material 18 is the same as in the application in a phase-change memory cell (FIG. 1). For the application of patterning, the thermoelectric layer 18 can be placed above or below the layer 116 that is to be patterned. A patterned layer 116 may be employed for creating an etch mask or for other lithographic processing. The pattern formed in layer 116 may be chemically treated such that the patterning provided by the thermoelectric current exposure may alter the layer to permit selective processing with respect to adjacent material in layer 116.

Figure 3:
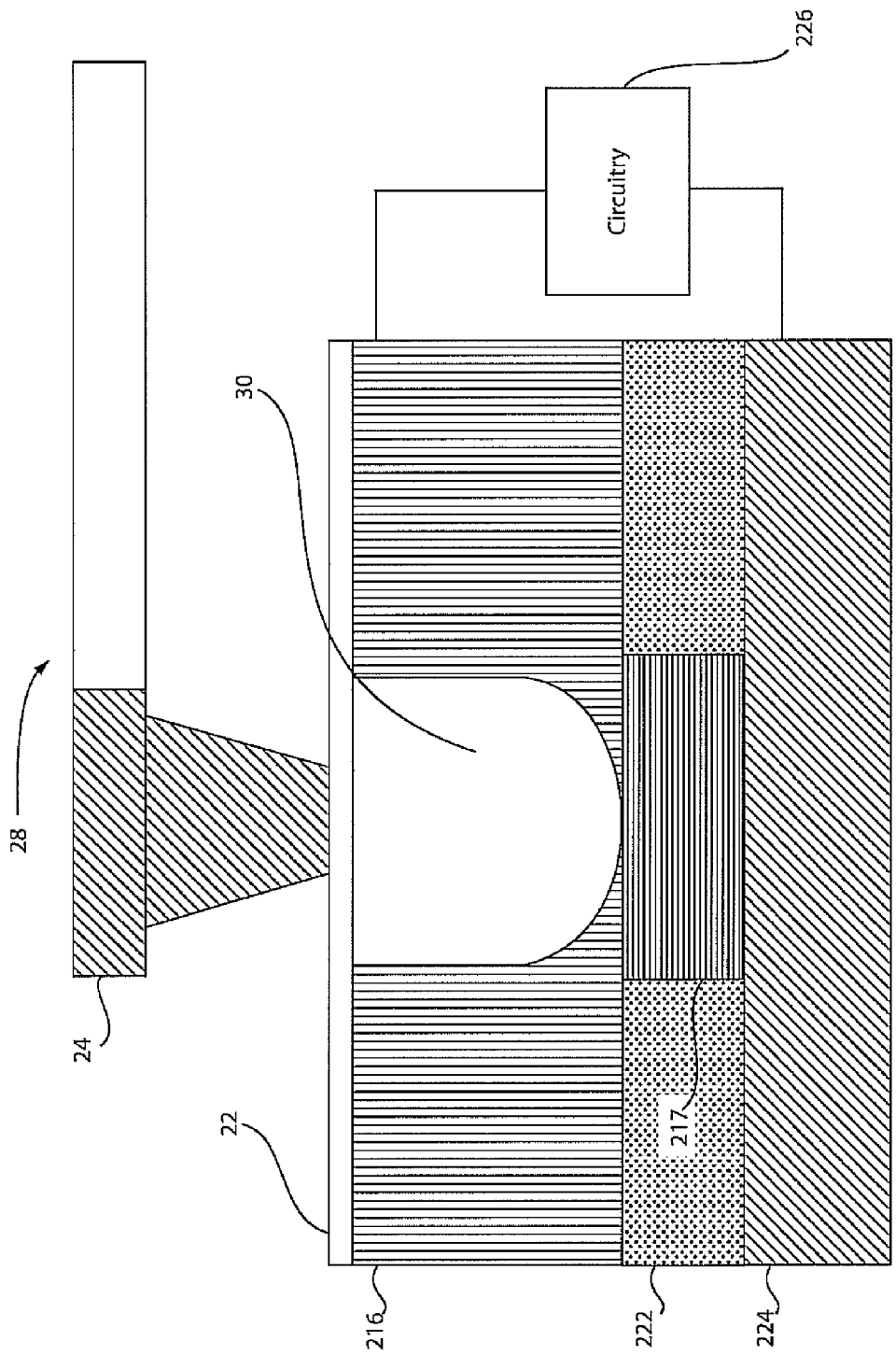
FIG. 3 is a cross-sectional view of a device/system for measuring a circuit component using a thermoelectric layer and external circuitry in accordance with one embodiment.

Referring to FIG. 3, for an application of electrical testing, a thermoelectric layer 216 is applied on top of electrodes 217 that are to be addressed. Electrodes 217 may be formed in a layer 222 (e.g., of dielectric material). Electrodes or other circuit components 217 may be connected or formed on other integrated circuits 224. A heat gradient 30 is induced by a heated probe 28 in contact or in proximity with one side of the thermoelectric layer 216. This local heating is less subject to chemical and tribological variation of the interface than in a direct electrical contact case. The thermoelectric layer 216 is employed to make a connection with the electrode 217 and induce a current or voltage therein. This induced current or voltage may be sensed by or through other circuitry 226 and thereby employed to test connections, continuity, resistance, etc. or other features or characteristics of electrode 217 and/or integrated circuit 224.

Figure 4:
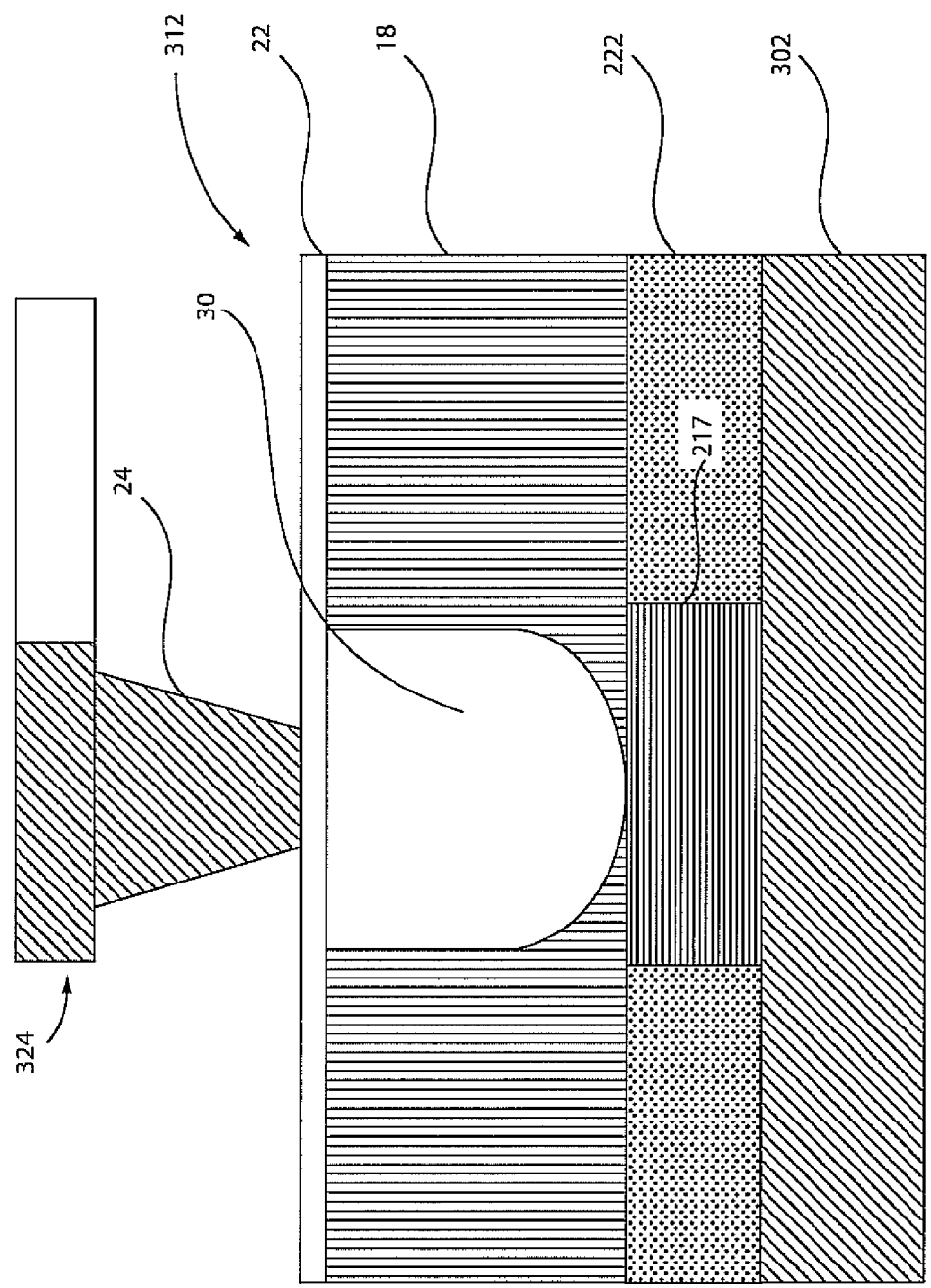
FIG. 4 is a cross-sectional view of a device/system for measuring a circuit component using a thermoelectric layer and internal circuitry in accordance with one embodiment.

Referring to FIG. 4, in a metrology or electric circuitry application, it is preferable to apply current or voltage to a local piece of circuitry 302 without having wires leading out of the device that permit individual addressing. The individual addressing is to be achieved using a local probe 324. According to the present principles, a device 312 is fabricated with a thermoelectric layer 18. The piece of circuitry 302 to be addressed is located, and the probe 324 is heated to permit current to flow in the device 312 to make a measurement. The measurement in the circuit 302 employs the connections, wires and circuit components (e.g., electrode 217) to make measurements of the circuit 302 using current flow generated in the thermoelectric layer 18. In particularly useful applications, the electrical contact to be made with the probe 324 is preferably in a size range of about 1 nm to about 100 nm. The capping layer 22 may be omitted if current flow directly to the probe 324 is desired.

Figure 5:
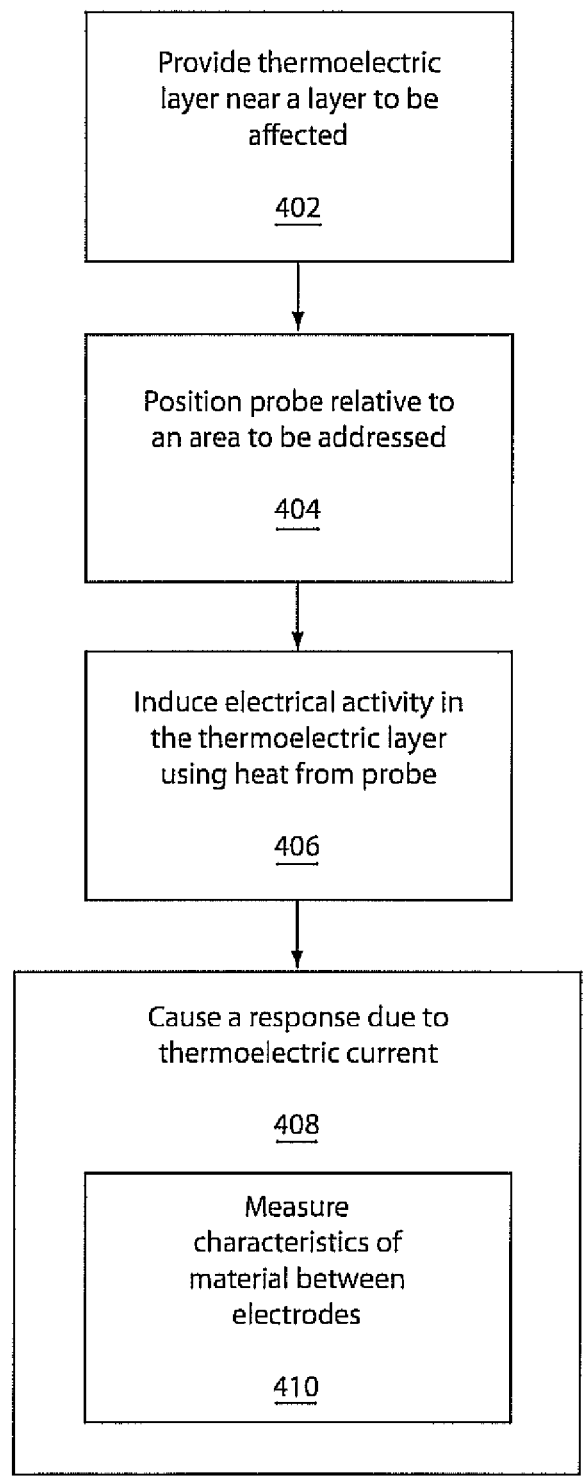
FIG. 5 is a flow diagram showing a method for addressing a location or area of a layer using a thermoelectric layer in accordance with one embodiment.

Referring to FIG. 5, a flow diagram shows a method for electrically addressing a layer in accordance with the present principles. In block 402, a thermoelectric layer is provided in proximity of an area to be addressed. The area to be addressed may include a memory cell, a layer to be patterned, a circuit component to be measured or characterized, etc. The thermoelectric layer may include at least one of $Bi_2Te_3$ and $Sb_2Te_3$.

In block 404, a probe is positioned in proximity of the thermoelectric layer. This may be in contact with or near the thermoelectric layer. In block 406, electrical activity is induced in the thermoelectric layer by applying heat from the probe.

In block 408, a response in the area to be addressed is caused by the charge created in the thermoelectric layer. The response may include causing a phase change in the cell (writing to the cell), reading a state of the cell, patterning a layer including the area to be addressed, measuring of a characteristic of the circuit component, etc.

In block 410, in one embodiment, electrodes may be employed that sandwich the thermoelectric layer (and perhaps other layers, e.g., a phase change layer). The induced electrical activity may be employed to measure current flow or resistivity between the electrodes using external circuitry to determine a property of the materials sandwiched between the electrodes.

Having described preferred embodiments of a thermoelectric device and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for electrically addressing an element, comprising:

providing a thermoelectric layer in proximity of an area to be addressed;

positioning a probe in proximity of the thermoelectric layer;

inducing electrical activity in the thermoelectric layer by applying heat from the probe; and causing a response in a memory cell disposed within the area to be addressed that includes at least one of a phase change and a reading of phase state of the memory cell.

2. The method as recited in claim 1, wherein the area to be addressed includes a layer to be patterned and the step of causing a response includes patterning the layer by causing a charge in the thermoelectric layer to affect the layer to be patterned.

3. The method as recited in claim 1, wherein the area to be addressed includes a circuit component and the step of causing a response includes causing a charge in the thermoelectric layer to affect the circuit component to permit a measurement of a characteristic of the circuit component.

4. The method as recited in claim 1, further comprising electrodes sandwiching the thermoelectric layer wherein inducing electrical activity includes measuring current flow between the electrodes through external circuitry.

5. The method as recited in claim 1, wherein the thermoelectric layer includes at least one of $Bi_2Te_3$ and $Sb_2Te_3$.

6. A device for electrically addressing an element, comprising:

a thermoelectric layer formed in proximity of an area to be addressed that includes a memory cell, the thermoelectric layer being configured to locally generate charge flow in response to an induced heat gradient from a probe; and a layer, including the area to be addressed, being configured to be responsive to the charge flow from the thermoelectric layer to cause a measurable response in the layer that includes at least one of a phase change and a reading of phase state of the memory cell.

7. The device as recited in claim 6, wherein the layer includes a layer to be patterned and the measurable response includes patterning the layer using charge from the thermoelectric layer.

8. The device as recited in claim 6, wherein the layer includes a circuit component and the measurable response includes measuring charge from the thermoelectric layer to permit a measurement of a characteristic of the circuit component.

9. The device as recited in claim 6, further comprising electrodes sandwiching the thermoelectric layer, and external circuitry coupled to the electrodes wherein charge flows in the external circuitry due to the charge flow from the thermoelectric layer.

10. The device as recited in claim 6, wherein the thermoelectric layer includes at least one of $Bi_2Te_3$ and $Sb_2Te_3$.

11. A system for electrically addressing an element, comprising:

a heated probe configured to be positioned over at least one addressable position on a device, the device including:

a thermoelectric layer formed in proximity of an area to be addressed that includes a memory cell, the thermoelectric layer being configured to locally generate charge flow in response to an induced heat gradient from the probe; and a layer, including the area to be addressed, being configured to be responsive to the charge flow from the thermoelectric layer to cause a measurable response in the layer that includes one of a phase change and a reading of phase state of the memory cell.

12. The system as recited in claim 11, wherein the layer includes a layer to be patterned and the measurable response includes patterning the layer using charge from the thermoelectric layer.

13. The system as recited in claim 11, wherein the layer includes a circuit component and the measurable response includes measuring charge from the thermoelectric layer to permit a measurement of a characteristic of the circuit component.

14. The system as recited in claim 11, further comprising electrodes sandwiching the thermoelectric layer, and external circuitry coupled to the electrodes wherein charge flows in the external circuitry due to the charge flow from the thermoelectric layer.

15. The system as recited in claim 11, wherein the thermoelectric layer includes at least one of $Bi_2Te_3$ and $Sb_2Te_3$.

* * * * *